(12) United States Patent
Ma

(10) Patent No.: US 7,083,457 B2
(45) Date of Patent: Aug. 1, 2006

(54) LAND GRID ARRAY SOCKET WITH PRESSING PLATE

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/091,962

(22) Filed: Mar. 28, 2005

(65) Prior Publication Data
US 2005/0215088 A1    Sep. 29, 2005

(30) Foreign Application Priority Data
Mar. 26, 2004    (TW) .............................. 93108269 A

(51) Int. Cl.
*H01R 13/62* (2006.01)

(52) U.S. Cl. ...................................... 439/331; 439/342

(58) Field of Classification Search ................ 439/331, 439/71, 342
See application file for complete search history.

(56) References Cited

U.S. PATENT DOCUMENTS

| RE32,370 | E  | * | 3/1987 | Bright et al. .................. 439/68 |
| 6,485,320 | B1 | * | 11/2002 | Ma ............................ 439/342 |
| 6,648,656 | B1 | * | 11/2003 | Ma .............................. 439/73 |
| 6,676,429 | B1 | * | 1/2004 | McHugh et al. ............. 439/331 |
| 6,699,047 | B1 | * | 3/2004 | McHugh et al. .............. 439/71 |
| 6,776,642 | B1 | * | 8/2004 | McHugh et al. ............ 439/331 |
| 6,914,192 | B1 | * | 7/2005 | Ju ............................ 174/94 R |
| 6,916,195 | B1 | * | 7/2005 | Byquist ...................... 439/342 |
| 2004/0095693 | A1 | * | 5/2004 | Shirai et al. ................... 361/1 |

\* cited by examiner

*Primary Examiner*—Hae Moon Hyeon
(74) *Attorney, Agent, or Firm*—Wei Te Chung

(57) ABSTRACT

A new land grid array socket (LGA, 100) provided according to a preferred embodiment of the LGA socket includes a base for receiving an integrated circuit (IC) package (200), a number of terminals (40) secured on the base, a pressing mechanism moveably attached on the base and being formed with at least one pressing portion (570) to securely press the IC package on the base. The at least one pressing asymmetrically pressingly engages with the IC package, thereby assuring uniform electrical engagement between the IC package and the terminals.

15 Claims, 6 Drawing Sheets

LAND GRID ARRAY SOCKET WITH PRESSING PLATE

BACKGROUND OF THE INVENTION

1. Field of the Invention

The present invention is directed to the art of electrical connectors, and more particularly to a land grid array (LGA) socket for electrically bridging two electrical interfaces such as a printed circuit board (PCB) and a central processing unit (CPU).

2. Description of the Related Art

A typical LGA socket is an electrical connector having a dielectric housing and a number of terminals arranged on the housing in an array manner, and is widely used to electrically connect a PCB with a CPU, but not limited thereto.

Referring to FIG. 8, a typical LGA socket 900 is shown, and includes a housing 92 and a number of terminals 94 secured on the housing 92. Each terminal 94 has a resilient contact arm (not labeled) extending beyond a top mating surface 920 for elastically electrically mating with a corresponding conductive pad (not shown) provided on a typical mating CPU 800. Typically, all the contact arms of the terminals 94 are compressed to deflect in a same slantwise direction.

In symmetrically pressing the CPU 800 on the housing 92 by cooperative operation of a pressing plate 96 and a cam driver 98 which are respectively attached to opposite sides of a stiffener 97 harnessing the housing 92, the CPU 800 may be prone to float on the contact arms. As a result, accurate position of the CPU 800 on the housing 92 may be difficult to be assured, even damage resulted from the un-stable floating of the CPU 800 may happen to the housing 92, the terminals 94 or/and the CPU 800.

What is needed is, accordingly, to provide a new LGA socket that overcomes the above-mentioned disadvantages.

SUMMARY OF THE INVENTION

A new LGA socket provided according to a preferred embodiment of the LGA socket may include a base for receiving an integrated circuit (IC) package, a number of terminals secured on the base, a pressing mechanism moveably attached on the base and being formed with at least one pressing portion to securely press the IC package on the LGA socket. The at least one pressing asymmetrically pressingly engages with the IC package, thereby assuring uniform electrical engagement between the IC package and the terminals.

DESCRIPTION OF PREFERRED EMBODIMENTS OF THE INVENTION

Figure 1:
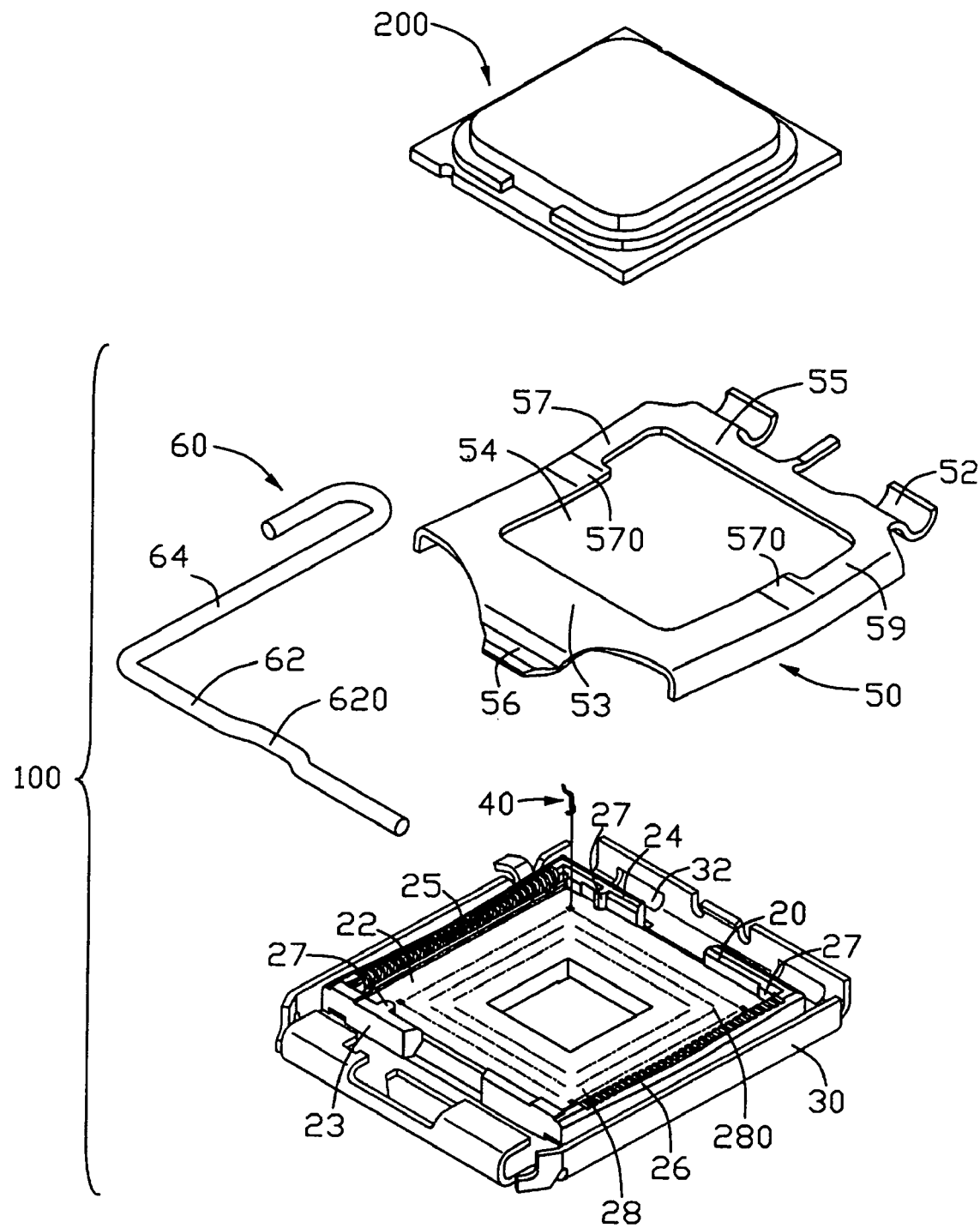
FIG. 1 is an isometric, exposed view of an LGA socket according to a preferred embodiment of the invention, together with a CPU ready to be mounted on the LGA socket, wherein the LGA socket includes a pressing member and a cam driver.

FIG. 1 shows a new LGA socket 100 according to a preferred embodiment of the invention. The LGA socket 100 includes a base consisting of a dielectric housing 20 and a melt stiffener 30 harnessed on the housing 20, a plurality of terminals 40 planted on the housing 20, a load plate 50 pivotally attached to an end of the stiffener 30, and a cam driver 60 pivotally attached to an opposite end of the stiffener 30.

Figure 4:
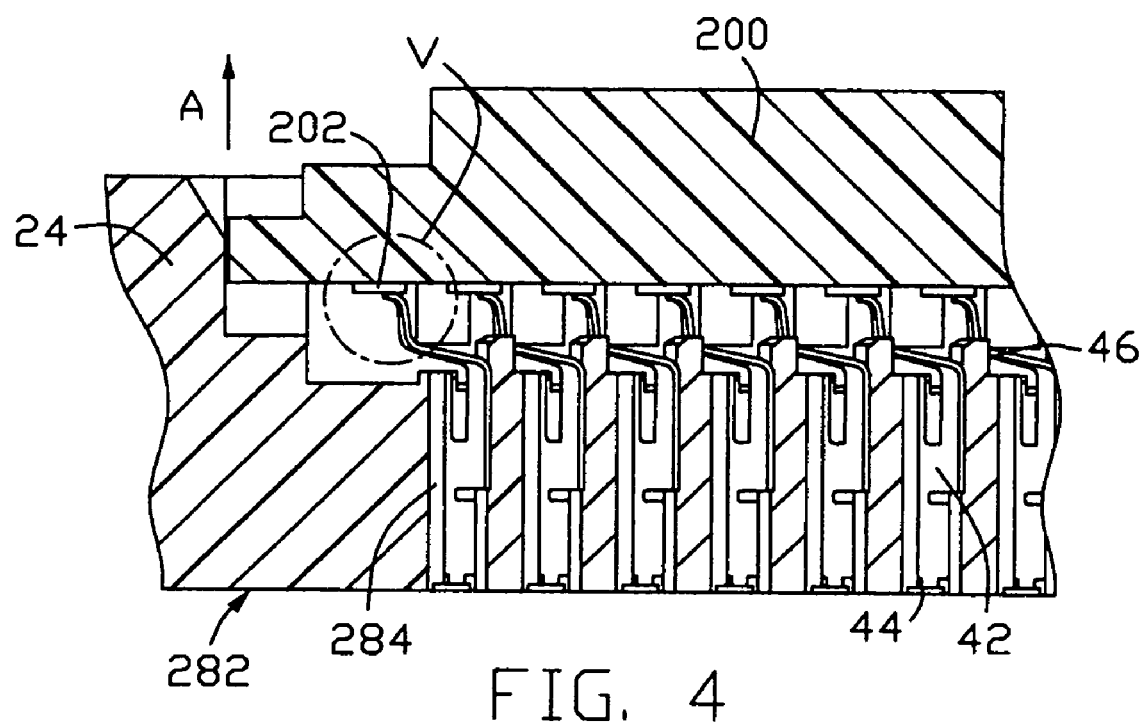
FIG. 4 is a partial cross-section view, showing the CPU mounting on terminals of the LGA socket.

A rectangular cavity 22 is defined in the housing 20, for receiving an electrical device, such as an IC package. In this preferred embodiment, the IC package is designated as a CPU 200. Four sidewalls, e.g. front, rear, left and right sidewalls 23, 24, 25 and 26, are provided around the cavity 22. Three protrusions 27 are formed on the rear and front sidewalls 24, 23, and intrude into the cavity 22. The three protrusions 27 are used to cooperatively position the CPU 200 in the cavity 22. Referring also to FIG. 4, the housing 20 has a floor 28 under the cavity 22, the floor 28 being formed with a top surface 280 and a bottom surface 282 opposing the top surface 280. A plurality of passageways 284 is defined in the housing 20 between the top surface 280 and the bottom surface 282, and communicates with the cavity 22.

Figure 5:
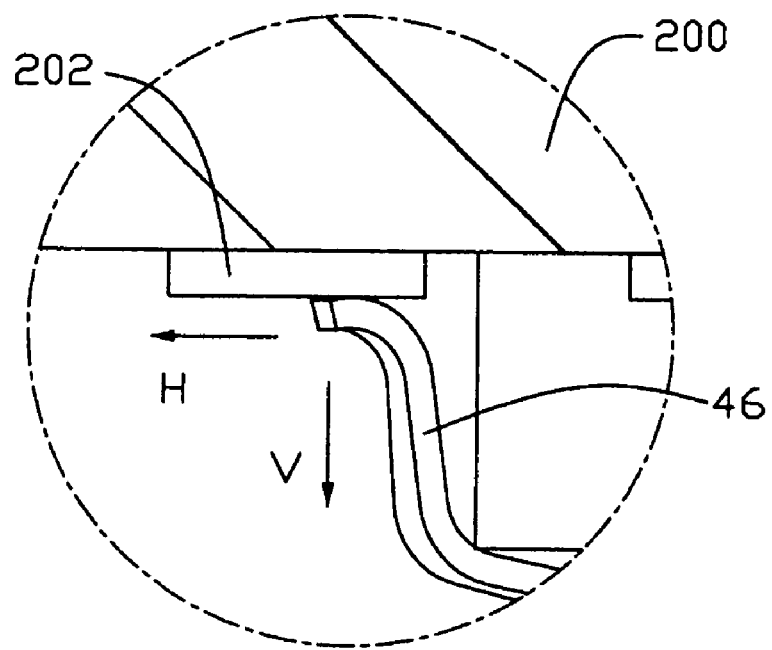
FIG. 5 is an enlarged view of a circled part in FIG. 4.

Referring also to FIGS. 4 and 5, each terminal 40 has a retention body 42, a lower connecting portion 44 extending downwardly from the body 42, and an upper resilient arm 46 extending upwardly into the cavity 22 for electrically mating with a corresponding conductive pad 202 provided on the CPU 200. In the preferred embodiment, the arms 46 of the terminals 40 slantwise and upward unanimously deflect toward the rear sidewall 24.

Figure 2:
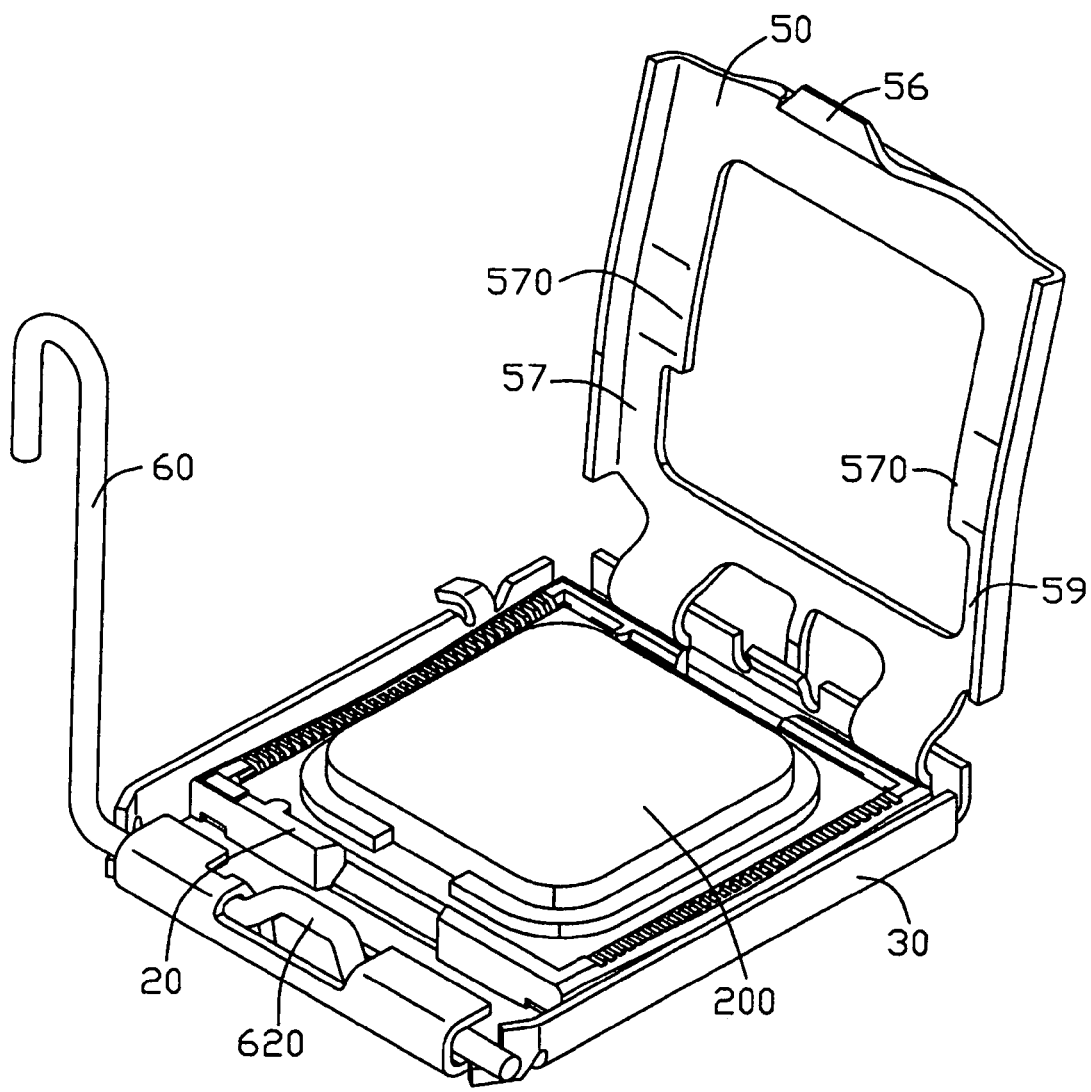
FIG. 2 is an isometric, assembled view of the LGA socket in FIG. 1, with the pressing member and the cam driver being disposed in an open situation, and the CPU being placed on the LGA socket.
Figure 3:
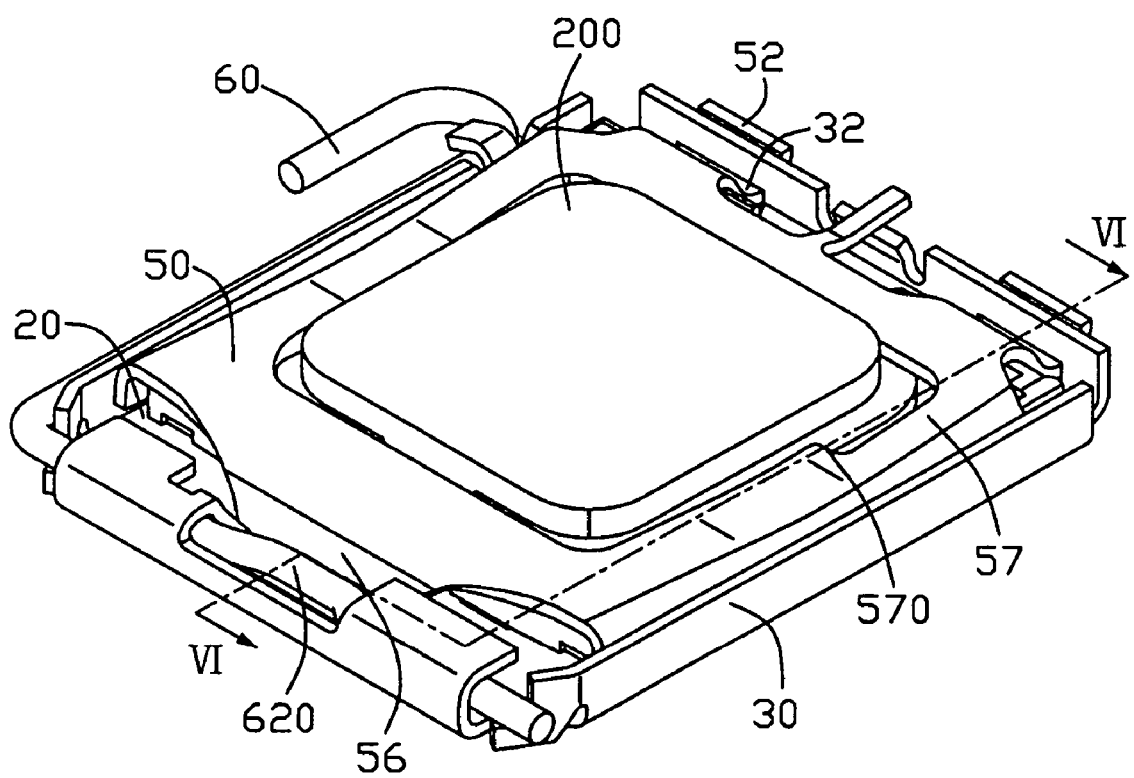
FIG. 3 is similar to FIG. 2, but showing the load plate and the cam driver in a closed situation, and cooperatively holding the CPU on the LGA socket.

Referring to FIGS. 1–3, the stiffener 30 is harnessed on the housing 20, and strengthens the housing 20. By insertion of a pair of tails 52 of the load plate 50 into corresponding holes 32 defined in the stiffener 30, an end of the load plate 50 is pivotally attached to the end of the stiffener 30. The load plate 50 further defines a window 54, and four sides, e.g. front, rear, left and right sides 53, 55, 57, 59, around the window 54.

Referring to FIGS. 1–3, the cam driver 60 has a shaft 62 pivotally attached to an opposite end of the stiffener 30, and a lever 64 exposed outside and rotatable around an axis of the shaft 62. The shaft 62 has a cam portion 620 adapted to mechanically mate with a head 56 of the load plate 50 when the load pate 50 rotates around an axis of the shaft from a free open position to a closed position, thereby cooperatively stably pressing the CPU 200 in the cavity 22.

In order to press the CPU 200, pressing means is provided on the load plate 50 to accurately press the CPU 200 in the cavity 22. In this preferred embodiment, the pressing means is a pair of V-shaped bent portions 570. The bent portions 570 extend coplanarly integrally from inner sides of the left and right sides 57, 59 of the load plate 50, respectively, and encroach into the window 54. Projections of the pressing portion 570a are located a distance away, in a horizontal direction, from a tranverse center line of the cavity 22, which is substantially perpendicular to the horizontal direction and parallel to the upper surface, and toward one of the protrusions 27. Of course, it is appreciated that the pressing means may be various depending on specific conditions.

In the preferred embodiment, to accurately press the CPU 200, the load plate 50 only has the pair of bent portions 570 adapted to press the CPU 200.

Referring to FIGS. 4–5, in pressing the CPU 200 by a pressing force F transmitting through the load pate 50 and the cam driver 60, the resilient arms 46 are compressed to deflect toward the rear sidewall 24 of the housing 20 in a horizontal direction H and a vertical direction V. Accordingly, the CPU 200 sitting on the resilient arms 46 may be brought to float toward the rear sidewall 24. Because a gap between a rear side of the CPU 200 and inner side of the protrusion 27 of the rear sidewall 24 is pretty small, the floating of the CPU 200 makes the CPU 200 abut against the protrusions 27 of the rear sidewall 24. When the CPU 200 is further pressed to move downwardly, a friction A between the CPU 200 and the protrusions 27 of the rear sidewall 24 lifts the CPU 200 up at an end thereof adjacent to the rear sidewall 24. As a result, the CPU 200 is deflected. Uniform electrical engagement between the CPU 200 and the arms 46 is destroyed.

Referring to FIGS. 1–3 and 6, In order to avoid the disadvantages, according to the preferred embodiment, the bent portions 570 are shifted toward the rear sidewall 24 from the middle of two opposite sides of the CPU 200 in a direction parallel to the top surface 280 and the horizontal direction H. The shift distance P of the bent portions 570 toward the rear sidewall 24 is key pole in balancing the CPU 200 on the housing 20 in pressing.

To decide a preferred shift distance P, an emulated experiment is conducted. In the emulate experiment, a peripheral area size of the CPU 200 is 37.5 mm×37.5 mm.

Figure 6:
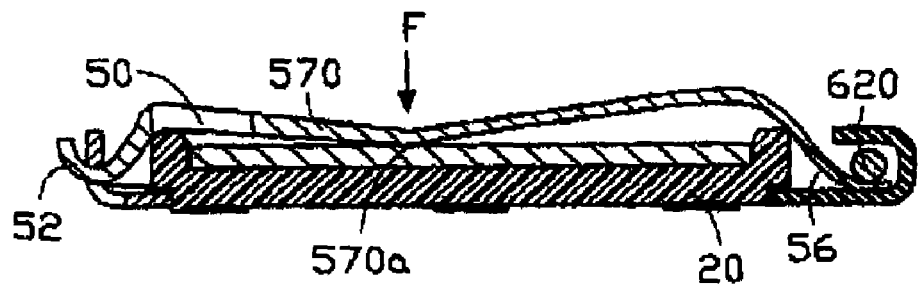
FIG. 6 is a cross-section view along a line VI—VI in FIG. 3.
Figure 7:
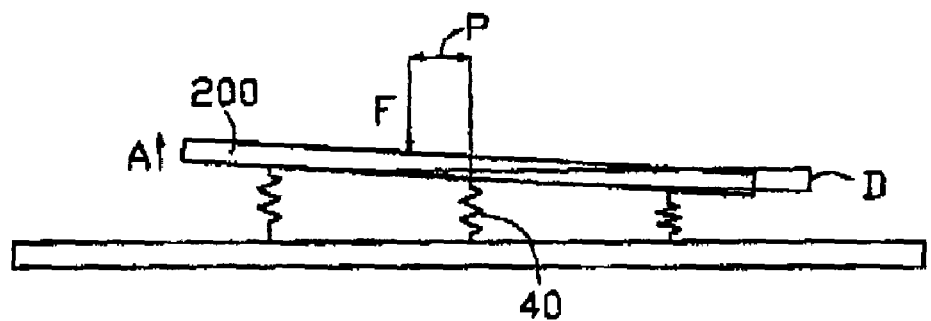
FIG. 7 is a simplified view of an emulated LGA socket in a specific experiment according to a preferred embodiment of the present invention.
Figure 8:
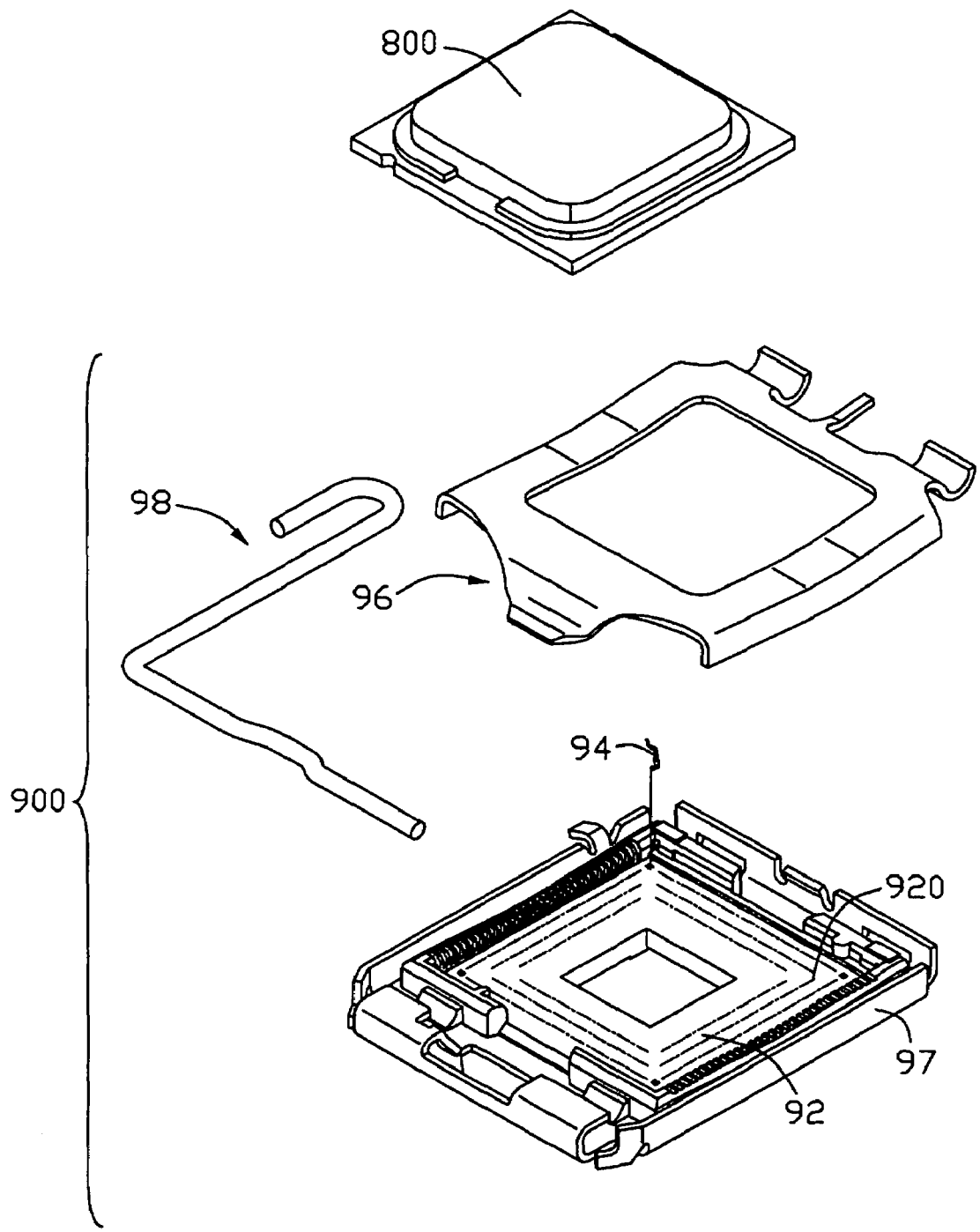
FIG. 8 is an assembled, isometric view of a typical LGA socket.

Referring to FIGS. 1, 6 and 7, in the following chart, D stands for a deflection, in the vertical direction V, between first and last rows of pads 202 of the CPU 200 (a negative number means a rear end of the CPU 200 adjacent to the rear sidewall 24 is higher than the front end of the CPU 200). P stands for a shift distance from a middle of the CPU 200 in a direction parallel to the top surface 280 and the horizontal direction H. The result of the experiment is shown as follows.

| P | 0 | 0.95 mm | 2.05 mm | 3.15 mm | 4.25 mm |
|---|---|---------|---------|---------|---------|
| D | −0.16 mm | −0.09 mm | 0.01 mm | 0.07 mm | 0.13 mm |

From the above chart, the shift distance P is preferred to be 2.05 mm. Even if the CPU 200 is deflected in pressing, the bent portions shifted 2.05 mm toward to the rear sidewall 24 prevents the CPU 200 from deflecting when the CPU 200 electrically mates with the arms 46 of the terminals 40. Thus, uniform electrical engagement between the arms 46 of the terminals 40 and the CPU 200 is assured when the CPU is secured on the LGA socket 100. It should be understood that in different cases the preferred shift distance may be changed depending on real specific conditions.

Furthermore, although the present invention has been described with reference to a preferred embodiment, it is not to be construed as being limited thereto. Various alterations and modifications can be made to the embodiments without in any way departing from the scope or spirit of the present invention as defined in the appended claims.

What is claimed is:

1. An electrical connector comprising:
    a base defining a accepting room;
    a bottom section formed on the base under the accepting room, the bottom section defining upper and lower surfaces and a plurality of passageways between said upper and lower surfaces;
    at least one protrusion being raised from the bottom section and being arranged around the accepting room;
    a plurality of contacts secured on corresponding passageways, each of the contacts being formed with a resilient arm; and
    a pressing mechanism being provided with at least one pressing portion; wherein when in use the arms are compressed to deflect in a horizontal direction parallel to the upper surface toward one of said at least one protrusion and in a vertical direction downwardly from the upper surface, when the connector is disposed in a closed position, projections of at least one pressing portion are located a distance away, in said horizontal direction, from a transverse center line of the accepting room which is substantially perpendicular to said horizontal direction and parallel to the upper surface, toward said one of said at least one protrusion.

2. The electrical connector of claim 1, wherein the pressing portion has a V-shaped configuration.

3. The electrical connector of claim 1, wherein the base comprises a dielectric housing and a stiffener harnessed on the housing.

4. The electrical connector of claim 3, wherein the pressing mechanism comprises a load plate pivotally attached to a side of the stiffener, and a driver pivotally attached to an opposite side of the stiffener.

5. The electrical connector of claim 4, wherein the load plate defines a hole and two pairs of sides, said at least one pressing portion is a pair of extending portions formed on one of the two pairs of sides.

6. The electrical connector of claim 5, wherein the extending portions integrally coplanarly extend from inner sides of the one of the two pairs of sides, respectively.

7. An electrical connector assembly comprising:
    an integrated circuit package; and
    an electrical connector comprising a base, a plurality of conductive terminals secured on the base and a pressing mechanism, the base defining a receiving space for receiving the IC package and sidewalls around the receiving space, the terminals each forming an resilient arm to electrically mate with the IC package; wherein during pressing of the IC package into the accepting apace to electrically mate with the arms of the terminals, the arms support the IC package and deflect toward one of the sidewalls to result in intervening engagement between the IC package and said one of the sidewalls, said intervening engagement tends to deflect the IC package, the pressing mechanism is provided with at least one pressing portion, said at least one pressing portion asymmetrically presses the IC package to prevent the IC package from deflecting when the IC package is fully mounted on the electrical connector.

8. The electrical connector assembly of claim 7, wherein said at least one pressing portion press on parts of the IC package, the parts of the IC package being situated away a distance from a first middle line of a horizontal top surface of the IC package in a first horizontal direction and toward said one of the sidewalls.

9. The electrical connector assembly of claim 8, wherein the parts of the IC package are situated symmetrically relative to a second middle line of the horizontal top surface of the IC package which is perpendicular to the first middle line.

10. The electrical connector assembly of claim 7, wherein in said pressing the arms of the terminals deflect in a horizontal direction and in a vertical direction.

11. The electrical connector assembly of claim 10, wherein said at least one pressing portion press on parts of the IC package, the parts of the IC package being situated away a distance from a middle of the IC package in said horizontal direction.

12. The electrical connector assembly of claim 11, wherein the parts of the IC package are situated symmetrically relative to a middle line of the IC package which is vertical to said horizontal direction.

13. An electrical connector comprising:
an insulative housing defining a terminal area defining thereof lengthwise and transverse directions perpendicular to each other, a transverse center line of said terminal area defined in said transverse direction;
a plurality of conductive terminals secured in the housing with upper contacting arms extending upwardly above an upper face of the housing for engagement with an IC package; and
a pressing mechanism moveable relative to the insulative housing to cooperate with the upper contacting arms for sandwiching the IC therebetween, and said pressing mechanism defining an abutment region for abutting against an upper face of the IC package; wherein
downward deflection of the upper contacting arms tends to result in a horizontal movement of the IC package in said lengthwise direction, and the abutment region of said pressing mechanism is not located at but by one side of said transverse center line for counterbalancing said tendency of horizontal movement of the IC package in said lengthwise direction when said pressing mechanism downwardly presses against the IC package.

14. The electrical connector as claimed in claim 13, wherein said pressing mechanism is pivotally moveable relative to the housing.

15. The electrical connector as claimed in claim 13, wherein said side of the transverse center line is located at a position relative to the transverse center line along said lengthwise direction.

* * * * *